US009508913B2

(12) United States Patent
Kruglick

(10) Patent No.: US 9,508,913 B2
(45) Date of Patent: Nov. 29, 2016

(54) ELECTROCALORIC EFFECT MATERIALS AND THERMAL DIODES

(75) Inventor: Ezekiel Kruglick, Poway, CA (US)

(73) Assignee: Empire Technology Development LLC, Wilmington, DE (US)

( * ) Notice: Subject to any disclaimer, the term of this patent is extended or adjusted under 35 U.S.C. 154(b) by 1040 days.

(21) Appl. No.: 12/999,684

(22) PCT Filed: Jun. 18, 2010

(86) PCT No.: PCT/US2010/039200
§ 371 (c)(1),
(2), (4) Date: Dec. 17, 2010

(87) PCT Pub. No.: WO2011/159316
PCT Pub. Date: Dec. 22, 2011

(65) Prior Publication Data
US 2011/0309463 A1    Dec. 22, 2011

(51) Int. Cl.
| H01L 29/66 | (2006.01) |
| F28F 7/00 | (2006.01) |
| H01L 21/02 | (2006.01) |
| H01L 37/02 | (2006.01) |
| F25B 21/00 | (2006.01) |

(52) U.S. Cl.
CPC ............. *H01L 37/02* (2013.01); *F25B 21/00* (2013.01); *F25B 2321/001* (2013.01); *Y02B 30/66* (2013.01)

(58) Field of Classification Search
CPC ...... H01L 37/00; H01L 37/025; H01L 37/02
See application file for complete search history.

(56) References Cited

U.S. PATENT DOCUMENTS

| 2,978,875 A | 4/1961 | Lackey et al. |
| 4,673,030 A * | 6/1987 | Basiulis ............... 165/272 |
| 4,757,688 A | 7/1988 | Basiulis et al. |
| 4,929,516 A | 5/1990 | Pryor et al. |
| 5,040,381 A | 8/1991 | Hazen |
| 5,229,566 A * | 7/1993 | Alexandres ............ 219/86.1 |
| 5,515,238 A | 5/1996 | Fritz et al. |
| 5,690,849 A | 11/1997 | DeVilbiss et al. |
| 6,105,381 A | 8/2000 | Ghoshal |
| 6,285,079 B1 | 9/2001 | Kunikiyo |
| 6,300,150 B1 | 10/2001 | Venkatasubramanian |
| 6,556,752 B2 | 4/2003 | Fang et al. |
| 6,588,215 B1 | 7/2003 | Ghoshal |
| 6,711,904 B1 | 3/2004 | Law et al. |
| 6,877,325 B1 | 4/2005 | Lawless |
| 7,293,416 B2 | 11/2007 | Ghoshal |

(Continued)

FOREIGN PATENT DOCUMENTS

| CN | 86101652 A | 11/1986 |
| CN | 1237791 A | 12/1999 |

(Continued)

OTHER PUBLICATIONS

K. Lankford, Spacecraft Thermal Control Handbook: Chapter 10: Heat Switches, 2002, p. 353.*

(Continued)

*Primary Examiner* — Whitney T Moore
(74) *Attorney, Agent, or Firm* — Dorsey & Whitney LLP

(57) ABSTRACT

Examples are generally described that include a substrate, an electrocaloric effect material at least partially supported by the substrate, and a thermal diode at least partially supported by the electrocaloric effect material.

19 Claims, 4 Drawing Sheets

(56) References Cited

U.S. PATENT DOCUMENTS

| | | |
|---|---|---|
| 7,305,839 B2 | 12/2007 | Weaver et al. |
| 7,421,845 B2 | 9/2008 | Bell |
| 7,475,551 B2 | 1/2009 | Ghoshal |
| 7,900,450 B2 * | 3/2011 | Gurin ............................ 60/641.2 |
| 7,951,467 B2 | 5/2011 | Tsushima |
| 8,869,541 B2 | 10/2014 | Heitzler et al. |
| 2001/0023591 A1 | 9/2001 | Maeda et al. |
| 2003/0033818 A1 | 2/2003 | Kucherov et al. |
| 2005/0045702 A1 | 3/2005 | Freeman et al. |
| 2005/0086948 A1 | 4/2005 | Milke-Rojo et al. |
| 2005/0109041 A1 | 5/2005 | Tanaka |
| 2005/0269065 A1 | 12/2005 | Chen |
| 2006/0092694 A1 | 5/2006 | Choi et al. |
| 2006/0137359 A1 | 6/2006 | Ghoshal |
| 2006/0139116 A1 | 6/2006 | Niki et al. |
| 2006/0201161 A1 | 9/2006 | Hirai et al. |
| 2007/0007613 A1 | 1/2007 | Wang et al. |
| 2008/0277162 A1 | 11/2008 | DeFoggio |
| 2008/0303375 A1 | 12/2008 | Carver |
| 2009/0139244 A1 | 6/2009 | Ullo et al. |
| 2009/0258248 A1 | 10/2009 | Tsushima |
| 2009/0293499 A1 | 12/2009 | Bell et al. |
| 2009/0301541 A1 | 12/2009 | Watts |
| 2009/0308081 A1 | 12/2009 | Quyang et al. |
| 2010/0037624 A1* | 2/2010 | Epstein et al. .................... 62/3.1 |
| 2010/0096113 A1 | 4/2010 | Varanasi et al. |
| 2010/0140772 A1* | 6/2010 | Lin et al. ....................... 257/686 |
| 2010/0175392 A1 | 7/2010 | Malloy et al. |
| 2010/0212327 A1 | 8/2010 | Barve et al. |
| 2010/0218511 A1 | 9/2010 | Rockenfeller |
| 2010/0230653 A1 | 9/2010 | Chen |
| 2010/0236258 A1 | 9/2010 | Heitzler et al. |
| 2011/0016885 A1 | 1/2011 | Zhang et al. |
| 2011/0063904 A1 | 3/2011 | Chang et al. |
| 2011/0113791 A1 | 5/2011 | Kruglick |
| 2011/0146308 A1 | 6/2011 | Casasanta |
| 2011/0203839 A1 | 8/2011 | Iwamoto |
| 2011/0309463 A1 | 12/2011 | Kruglick |
| 2012/0055174 A1 | 3/2012 | Kruglick |
| 2012/0267090 A1 | 10/2012 | Kruglick |
| 2013/0067934 A1 | 3/2013 | Kruglick |
| 2013/0067935 A1 | 3/2013 | Kruglick |

FOREIGN PATENT DOCUMENTS

| | | |
|---|---|---|
| CN | 1992358 A | 7/2007 |
| CN | 2932237 Y | 8/2007 |
| CN | 101246947 | 8/2008 |
| CN | 101291769 | 10/2008 |
| CN | 101587934 | 11/2009 |
| CN | 101842647 | 9/2010 |
| JP | H11177151 A1 | 7/1999 |
| WO | 2006056809 A1 | 6/2006 |
| WO | WO 2006/056809 A1 | 6/2006 |
| WO | 2008137940 A1 | 11/2008 |
| WO | WO 2009/126344 A2 | 10/2009 |

OTHER PUBLICATIONS

"International Search Report dated Aug. 11, 2010 for Application No. PCT/US2010/039200".

Ashley, S., "Cool Polymers: Toward the Microwave Oven Version of the Refrigerator", *Scientific American Magazine* Printed Apr. 7, 2009 from Internet <http://www.sciam.com/article.cfm?id=cool-polymers&print=true> Oct. 30, 2008, pp. 1-2.

Kobayashi, W. et al., "An Oxide Thermal Rectifier", [retrieved on Aug. 4, 2010]. Retrieved from the Internet <URL: http://arxiv.org/abs/0910.1153> Oct. 7, 2009, pp. 1-2.

Mischenko, A. et al., "Giant Electrocaloric Effect in Thin-Film $PbZr_{0.95}Ti_{0.05}O_3$", *Science*, vol. 311 Downloaded from Internet on Oct. 21, 2009 <http://www.sciencemag.org> Mar. 3, 2006, pp. 1270-1271.

Neese, B. et al., "Large Electrocaloric Effect in Ferroelectric Polymers Near Room Temperature", *Science* vol. 321 Downloaded from Internet on Apr. 7, 2009 <http://www.sciencemag.org> Aug. 8, 2008, pp. 821-823.

Seim, H. et al., "Growth of $LaCoO_3$ thin films from β-diketonate precursors", *Applied Surface Science*, vol. 112 1997, pp. 243-250.

Waller, D. et al., "The effect of pulse duration and oxygen partial pressure on $La_{0.7}Sr_{0.3}CoO_{3-\delta}$ and $La_{0.7}Si_{0.3}CO_{0.2}Fe_{0.8}O_{3-\delta}$ films prepared by laser ablation", *Solid State Ionics*, vol. 134 2000, pp. 119-125.

Extended European Search Report with opinion for European Application No. EP10853373.8 mailed on Jan. 2, 2014.

"Heat Diode Paves the Way for Thermal Computing", Technology Review, accessed at http://www.technologyreview.com/blog/arxiv/24222/?a=f.

International Search Report and Written Opinion From PCT Appl # PCT/US12/47013, Oct. 15, 2012.

International Search Report and Written Opinion From PCT Appl # PCT/US11/52569, Dec. 20, 2011.

International Search Report and Written Opinion From PCT Appl # PCT/US11/52577, Dec. 21, 2011.

International Search Report and Written Opinion for PCT/US2010/047887 issued on Nov. 12, 2010.

International Search Report and Written Opinion for International Patent Application No. PCT/US2011/033220 mailed Jun. 4, 2011.

International Search Report mailed Nov. 20, 2012 in PCT/US2012/055872.

"Thermal Analysis of Semiconductor Systems", Freescale Semiconductor, Inc White Paper, 2008, 1-24.

Akcay, et al., "Influence of mechanical boundary conditions on the electrocaloric properties of ferroelectric thin films", Journal of Applied Physics 103, 2008.

Arik, M. et al., "Enhancement of pool boiling critical heat flux in dielectric liquids by microporous coatings", International Journal of Heat and Mass Transfer, vol. 50, 2007, pp. 997-1009.

Bai, et al., "Direct Measurement of Giant Electrocaloric Effect in BaTiO3 Multilayer Thick Film Structure Beyond Theoretical Prediction", 2010 Applied Physics Letters 96, 3pp.

Chasiotis, I., "Atomic Force Microscopy in Solid Mechanics", in Springer Handbook of Experimental Solid Mechanics, Chapter 17.2.5, PZT Actuator Nonlinearities, eds., Sharpe Jr. W.N., pp. 420-423 (2008).

Dames, "Solid State Thermal Rectification with Existing Bulk Materials", Journal of Heat Transfer 131, No. 6, 2009.

Epstein, et al., "Electrocaloric Devices Based on Thin-Film Heat Switches", 2009 Journal of Applied Physics 106, 7pp.

Epstein, "Photonic and Electronic Cooling", International Conference on Emerging Trends in Electronic and Photonic Devices & Systems, Electro '09, Dec. 2009.

Fett, et al., "Nonsymmetry in the Deformation Behavior of PZT", Journal of Materials Science Letters 17 No. 4, 1998.

Kim, et al., "Thermal Disturbance and its Impact on Reliability of Phase-Change Memory Studied by the Micro-Thermal Stage".

Lencer, et al., "Design Rules for Phase-Change Materials in Data Storage Applications", Advanced Materials.

Li, B. et al., "Interface Thermal Resistance between Dissimilar Anharmonic Lattices", Phys. Rev. Lett., vol. 95, Issue: 10, 2005, pp. 4.

McNeil, D A., "Pressure Drop and Heat Transfer Distributions Around a Bundle of Drop and Heat Transfer Distributions of Plasma Treated Tubes Condensing Dropwise", EPSRC, UK Department of trade and Industry Report, Dec. 1999.

Morita, et al., "Ferroelectric Properties of an Epitaxial Lead Zirconate Titanate Thin Film Deposited by a Hydrothermal Method Below the Curie Temperature", Applied Physics Letters vol. 84, No. 25, Jun. 21, 2004.

Peyrard, M, "The design of a thermal rectifier", Europhys. Lett. vol. 76, Issue: 1, 2006, pp. 49-55.

Salam, B. et al., "Pressure drop measurements in a low pressure steam condenser with a horizontal bundle of staggered tubes", Applied Thermal Engineering, vol. 24, 2004, pp. 1365-1379.

(56) References Cited

OTHER PUBLICATIONS

Sebald, G et al., "Pyroelectric Energy Conversion: Optimization Principles", IEEE Transactions on Ultrasonics, Ferroelectrics, and Frequency Control, vol. 5, 2008, 538-551.
Servalli,, "A 45nm Generation Phase Change Memory Technology", IEEE International Electron Devices Meeting, 2009, 5.7.1-5.7.4.
Sinyavskii,, "Electrocaloric Refrigerators: A Promising Alternative to Current Low-Temperature Apparatus", Chemical and Petroleum Engineering, vol. 31, No. 5-6, Jun. 1995, 295-306.
Surana, R R., "High Strain Functionally Graded Barium Titanate and its Mathematical Characterization", A dissertation submitted to the Division of Research and Advanced Studies of the University of Cincinatti, 2004, pp. 105.
Terraneo, M., "Controlling the Energy Flow in Nonlinear Lattices: A Model for a Thermal Rectifier", Phys. Rev. Lett. vol. 88, Issue: 9, 2002, pp. 4.
Vereshchagina, E, "Investigation of Solid-State Cooler Based on Electrocaloric Effect", Lappeenranta University of Technology, MS Thesis, 2007, pp. 131.

* cited by examiner

ELECTROCALORIC EFFECT MATERIALS AND THERMAL DIODES

CROSS-REFERENCE TO RELATED APPLICATION

The present application is a U.S. National Stage filing under 35 U.S.C. §371 of International Application No. PCT/US2010/039200, filed on Jun. 18, 2010, and entitled "ELECTROCALORIC EFFECT MATERIALS AND THERMAL DIODES".

BACKGROUND

Electrocaloric effect materials are materials that exhibit a change in temperature of the material responsive to an electric field. Without being bound by theory, the electrocaloric effect may be due in part to the electric field causing a changed entropy capacity in the material. The application of an electric field may, for example, change a number of available entropy states, causing atoms of the material to vibrate at a higher temperature, raising the temperature of the material.

Electrocaloric effect materials include lead zirconate titanate and some polymers, among other electrocaloric effect materials. Electrocaloric effect materials may be used in a heat pump by physically connecting and disconnecting the electrocaloric effect material to and from a heat source.

Unless otherwise indicated herein, the materials described in this section are not prior art to the claims in this application and are not admitted to be prior art by inclusion in this section.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying drawings, in which:

In the drawings.

DETAILED DESCRIPTION

Figure 1:
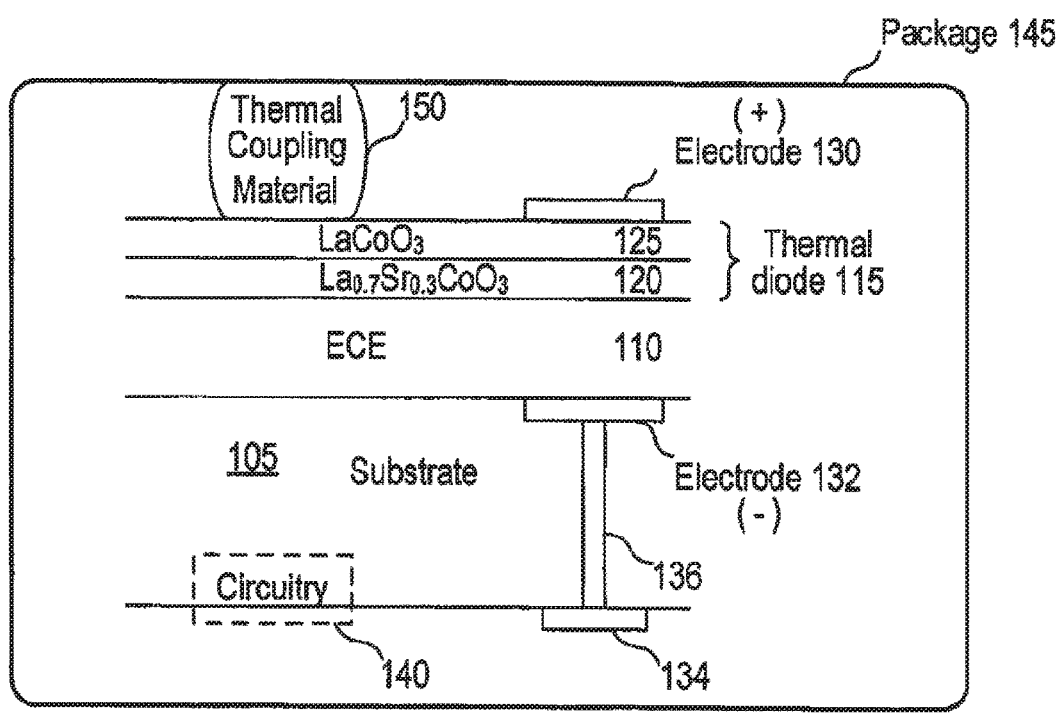
FIG. 1 is a schematic illustration of a cross-section of a device 100.

In the following detailed description, reference is made to the accompanying drawings, which form a part hereof. In the drawings, similar symbols typically identify similar components, unless context dictates otherwise. The illustrative examples described in the detailed description, drawings, and claims are not meant to be limiting. Other examples may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are implicitly contemplated herein.

This disclosure is drawn, inter alia, to methods, systems, devices, and/or apparatus generally related to a substrate, an electrocaloric effect material at least partially supported by the substrate, and a thermal diode at least partially supported by the electrocaloric effect material.

FIG. 1 is a schematic illustration of a cross-section of a device 100 arranged in accordance with at least some examples of the present disclosure. The device 100 includes a substrate 105, and electrocaloric effect (ECE) material 110 and a thermal diode 115. The thermal diode 115 includes a layer 120 of $La_{0.7}Sr_{0.3}CoO_3$ and a layer 125 of $LaCoO_3$. Electrodes 130 and 132 are positioned to apply an electric field across the ECE material 110. The electrode 132 may be coupled to a pad 134 on an opposite surface of the substrate 105 using a through-substrate interconnect 136 extending from one face of the substrate 105 to the other. Circuitry 140 may be located in or on the substrate 105. A package 145 may be thermally coupled to the thermal diode 115 using a thermal coupling material 150 or other thermal connection.

The substrate 105 may generally be any type of substrate, and examples of devices described herein may pump heat to or from a surface of the substrate 105. Example substrates include silicon substrates and polymer substrates. In some examples, the substrate 105 may not be present, and the ECE material 110 and thermal diode 115 may be provided as a film.

The ECE material 110 may generally be any suitable ECE material. The ECE material 110 may be at least partially supported by the substrate 105. In the example of FIG. 1, the ECE material 110 directly contacts the substrate 105, however in other examples, the ECE material 110 may be in partial or indirect contact with the substrate 105, yet still able to transfer heat to or from the substrate 105, such as through an intervening layer. Any suitable ECE materials may be used, including lead zirconate titanate and polymers.

The thermal diode 115 may generally be any suitable thermal diode that may conduct heat preferentially to or from the substrate 105. That is, the thermal diode 115 may have asymmetrical thermal conductance, in that heat may be transported more readily in one direction than in another. The thermal diode 115 may be at least partially supported by the ECE material 110. In the example of FIG. 1, the thermal diode 115 directly contacts the ECE material 110, however, in other examples, the thermal diode 115 may be in partial or indirect contact with the ECE material 110, yet still able to transfer heat to or from the ECE material 110, such as through an intervening layer.

The thermal diode 115 may be implemented using any of a variety of suitable materials having different temperature coefficients of thermal conductivity. The materials having different temperature coefficients of thermal conductivity are in thermal contact with one another, and heat may then more readily flow in one direction than the other. In some examples, the thermal diode 115 may be implemented using two metallic oxide crystalline materials. The thermal diode 115 may also be implemented using two cobalt oxide materials. As shown in FIG. 1, the thermal diode may be implemented using lanthanum cobalt oxide 120 and lanthanum strontium cobalt oxide 125. As shown in FIG. 1, the thermal diode preferentially conducts heat from the ECE material 110 out toward the package 145. An example of thermal rectification using cobalt oxides is described at W. Kobayashi, Y. Teraoka, and I. Terasaki, "An oxide thermal rectifier," 0910.1153 (Oct. 6, 2009), available at http://arxiv.org/abs/0910.1153, which article is hereby incorporated by reference in its entirety for any purpose.

The electrodes 130 and 132 may be positioned to apply an electric field across the ECE material 110. The electric field may also be generated across the thermal diode 115, but need not be in some examples. Some examples may include a through-substrate interconnect 136 to allow a voltage to be applied at an opposite face of the substrate 105.

Circuitry 140 may be formed within or on the substrate 105. For example, the circuitry 140 may include processor circuitry and the device 100 may function to dissipate heat generated by the circuitry 140.

A package 145 may be coupled to the thermal diode 115 through thermal coupling material 150. This may allow heat to be transferred from the substrate 105 to the package 145. In some examples, the thermal coupling material 150 may couple the package 145 to the electrode 130. In some examples, the electrode 130 may extend across the surface of the thermal diode 115, and heat may be transferred through the electrode 130 to the thermal coupling material 150 and/or the package 145. The package 145 may generally be any type of package completely or partially enclosing the substrate, such as a computer or other personal electronics case, such as an aluminum case, or in other examples, a ceramic package, or a metal capped package. Some examples may not include a package, and some other heat dump may be used to absorb heat transferred from the substrate 105. Although not shown in FIG. 1, external connections may be made from outside the package to, for example, the circuitry 140, and electrodes 134 and 130.

Figure 2:
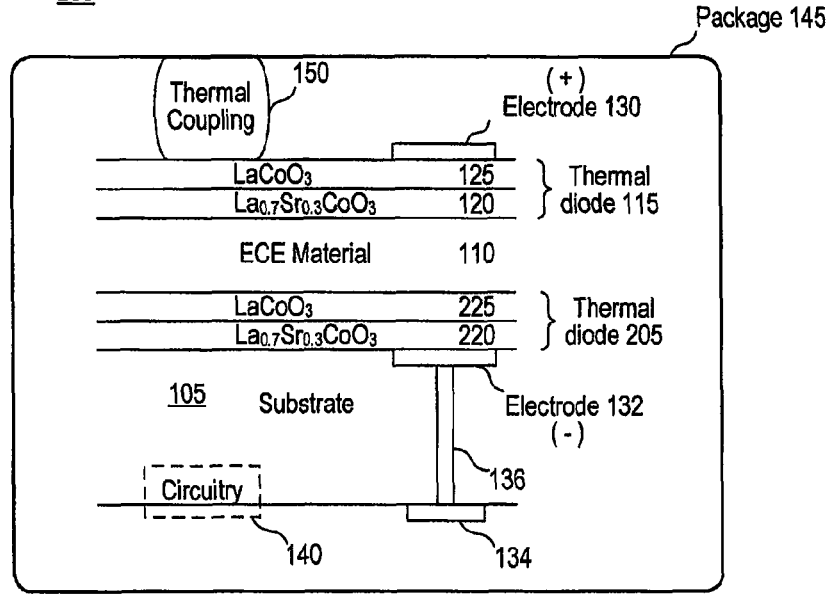
FIG. 2 is a schematic illustration of a cross-section of a device 200.

FIG. 2 is a schematic illustration of a cross-section of a device 200 arranged in accordance with at least some examples of the present disclosure. As described above with reference to FIG. 1, the device 200 includes the ECE material 110 and thermal diode 115, including a layer 120 of $La_{0.7}Sr_{0.3}CoO_3$ and a layer 125 of $LaCoO_3$. The device 200 also includes another thermal diode 205 between the ECE material 110 and the substrate 105, including another layer 220 of $La_{0.7}Sr_{0.3}CoO_3$ and another layer 225 of $LaCoO_3$. The thermal diode 205 may provide preferential heat transfer from the substrate 105 to the ECE material 110, and reduce heat transfer between the ECE material 110 and the substrate 105.

Figure 3:
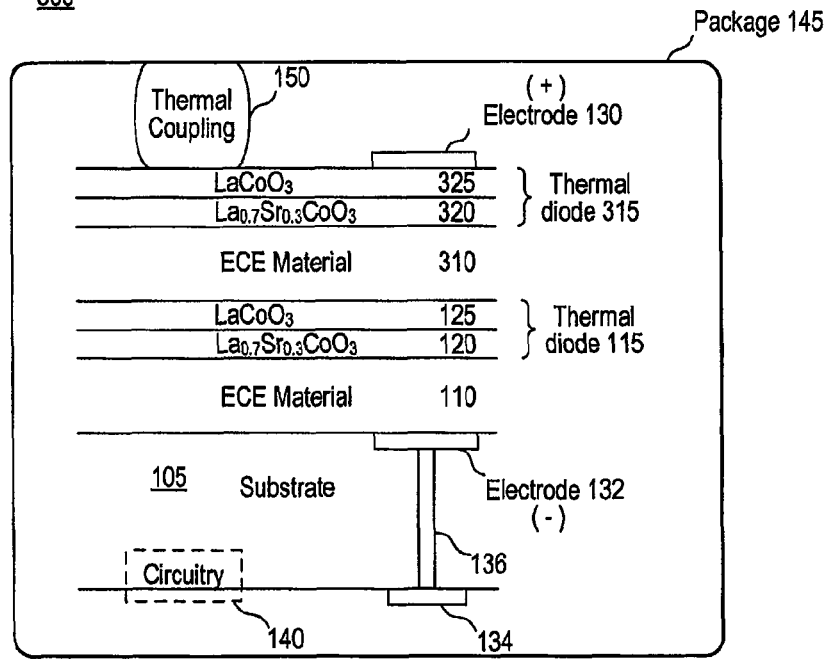
FIG. 3 is a schematic illustration of a cross-section of a device 300.

FIG. 3 is a schematic illustration of a cross-section of a device 300 arranged in accordance with at least some examples of the present disclosure. In addition to the ECE material 110 and the thermal diode 115, the device 300 includes another ECE material 310 and another thermal diode 315, including another layer 320 of $La_{0.7}Sr_{0.3}CoO_3$ and another layer 325 of $LaCoO_3$.

The ECE material 310 may be the same type of ECE material as the ECE material 110, or may be a different type.

Any number of additional ECE material and thermal diode stacks may be used in examples of devices arranged in accordance with the present disclosure. Generally, as additional ECE material layers are included, a greater temperature difference across the resultant material stack may be sustained.

Figure 4:
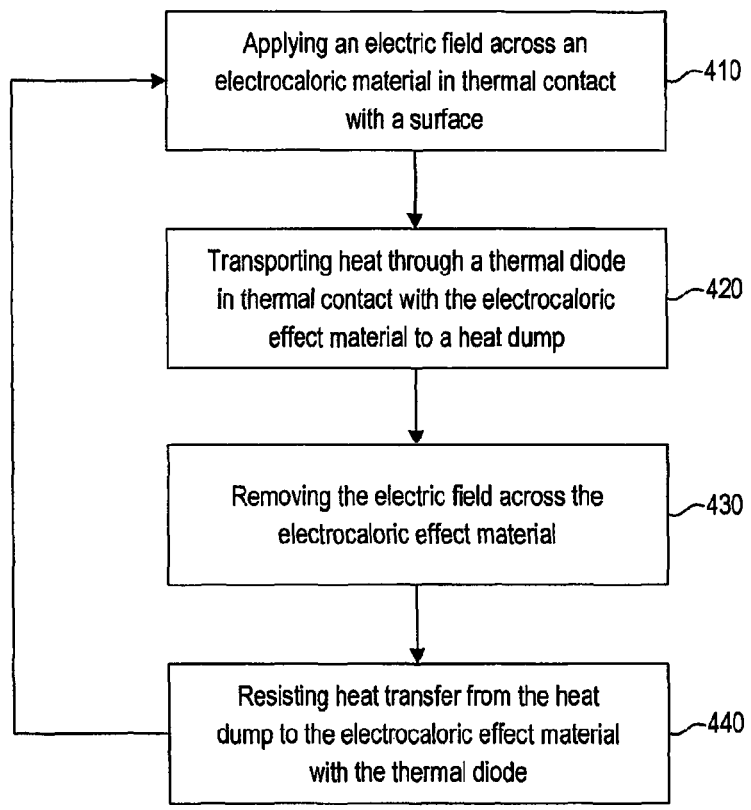
FIG. 4 is a flowchart illustrating an example method of transferring heat.

FIG. 4 is a flowchart illustrating an example method of transferring heat. In block 410, an electric field may be applied across an electrocaloric material in thermal contact with a surface. For example, referring back to FIG. 1, a voltage may be applied to the electrodes 132 and 130 to generate an electric field across the ECE material 110, which may be in thermal contact with a surface of the substrate 105. In block 420, heat may be transported through a thermal diode in thermal contact with the electrocaloric effect material to a heat dump. For example, referring back to FIG. 1, as an electric field is applied across the ECE material 110, the material may increase in temperature, and heat may be transferred from the substrate 105 to the ECE material 110, through the thermal diode 115 and to the thermal coupling material 150, package 145 or other heat dump. In block 430, the electric field across the electrocaloric material may be removed. This may cause the electrocaloric material to reduce in temperature, and the electrocaloric material may now be at a lower temperature than the heat dump and the substrate. In block 440, heat transfer from the heat dump to the electrocaloric effect material may be resisted with the thermal diode while thermal energy may flow more freely from the substrate to the electrocaloric effect material. Referring back to FIG. 1, the thermal diode 115 may resist heat transfer from the package 145 to the ECE material 110 when the ECE material 110 is at a lower temperature than the package 145. The blocking of heat transfer from the package 145 may allow the ECE material 110 to absorb more heat from the substrate 105. The blocks 410-440 may then be repeated to continue the heat pumping.

In this manner, heat may be pumped from the substrate 105 to a heat dump by applying a pulsed electric field to the ECE material 110 of FIG. 1. In a similar manner, heat may be pumped using the devices 200 and 300 shown in FIGS. 2 and 3, respectively. Accordingly, the devices 100, 200, and 300 may represent solid state ECE cooling devices with no moving parts.

A square wave, or other oscillating, voltage may be applied to the electrocaloric material to apply and remove the electric field in blocks 410 and 430.

Figure 5:
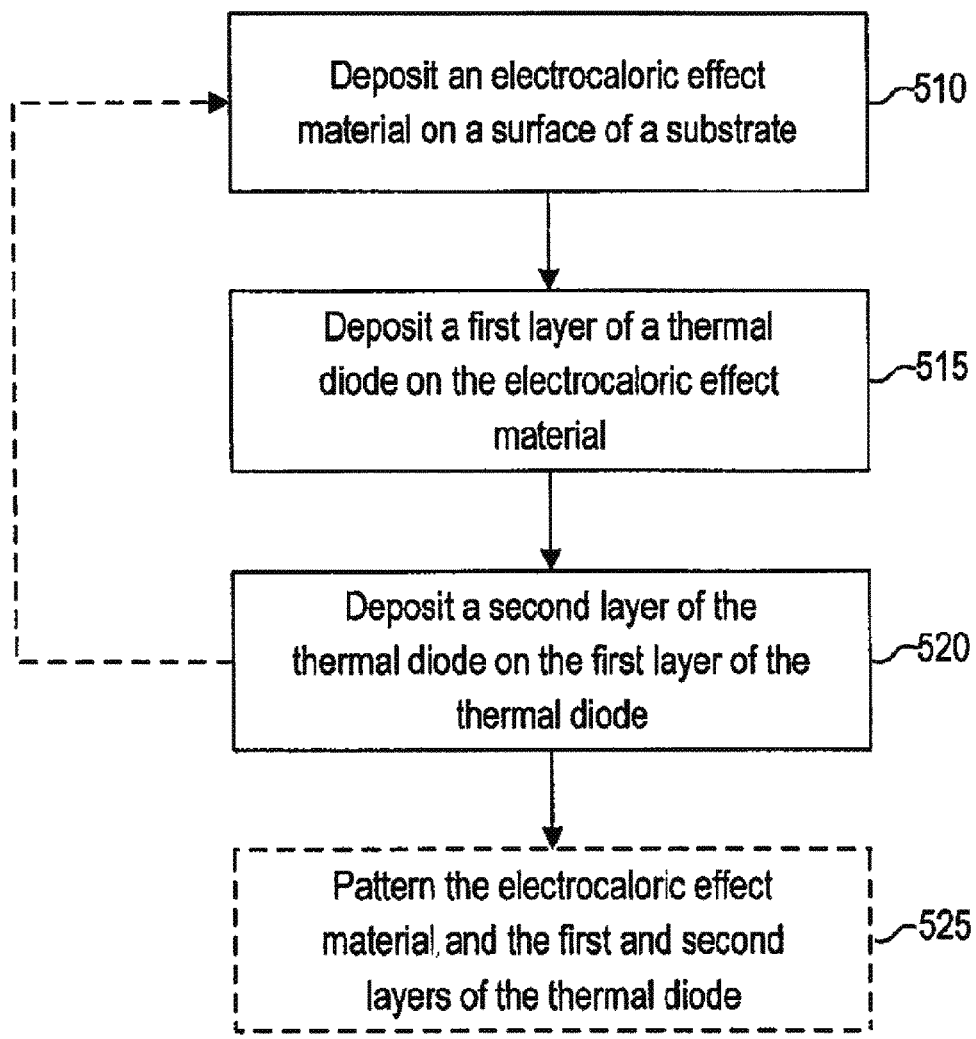
FIG. 5 is a flowchart of an example method for making a device; all arranged in accordance with at least some examples of the present disclosure.

FIG. 5 is a flowchart of an example method for making a device. In block 510, an electrocaloric effect material may be deposited on a surface of a substrate. In block 515, a first layer of a thermal diode may be deposited on the electrocaloric effect material. In block 520, a second layer of the thermal diode may be deposited on the first layer of the thermal diode. Blocks 510-520 may optionally be repeated. In block 525, the electrocaloric effect material, and the first and second layers of the thermal diode may optionally be patterned.

Generally, any or all of the blocks 510-525 may be performed using semiconductor fabrication techniques compatible with those used to fabricate circuitry, such as the circuitry 140 of FIG. 1.

In block 510, the electrocaloric effect material may be deposited using hydrothermal deposition. For example, referring back to FIG. 1, the ECE material 110 may be lead zirconate titanate, and may be deposited using hydrothermal deposition. One example of a hydrothermal deposition process for lead zirconate titanate is described in Takeshi Morita, et al., "Ferroelectric properties of an epitaxial lead zirconate titanate thin film deposited by a hydrothermal method below the Curie temperature," *Applied Physics Letters* 84, no. 25 (June 21, 20040: 5094-5096), which article is hereby incorporated by reference in its entirety for any purpose. In one example, a layer of lead zirconate titanate may be deposited in block 510 to a thickness of between about 7 μm and about 10 μm. Hydrothermal deposition may be advantageous because it may occur at a low temperature compatible with circuitry, such as the circuitry 140 of FIG. 1, already present on or in the substrate 105. Other deposition techniques, including but not limited to sputtering, may also be used.

In block 515, the first layer of the thermal diode may be deposited using pulsed laser or sputter deposition. For example, referring back to FIG. 1, the $La_{0.7}Sr_{0.3}CoO_3$ layer 125 may be deposited using pulsed laser or sputter deposition. An example of pulsed laser deposition is described in D Waller, et. al. "The effect of pulse duration and oxygen partial pressure on $La_{0.7}Sr_{0.3}CrO_{3-\delta}$ and $La_{0.7}Sr_{0.3}Co_{0.2}Fe_{0.8}O_{3-\delta}$ films prepared by laser ablation," *Solid State Ionics* 132 (2000) 119-125, which article is hereby incorporated by reference in its entirety for any purpose. Pulsed laser deposition may be advantageous in some examples because it may occur at a lower temperature than other techniques, such as sputtering. Other techniques may, however, also be used. In one example, a $La_{0.7}Sr_{0.3}CoO_3$ layer of about 1 μm thickness or more is deposited in block 515. The thickness of the layer deposited in block 515 may vary, however, in accordance with implementation in particular fabrication facilities.

In block 520, the second layer of the thermal diode may be deposited using diketonate based vapor deposition. For example, referring back to FIG. 1, the $LaCoO_3$ layer 120 may be deposited using diketonate based vapor deposition. An example of diketonate based vapor deposition may be found in H. Seim, et. al. "Growth of $LaCoO_3$ thing films from β-diketonate precursors," *Applied Surface Science* 112 (1997) 243-250, which article is hereby incorporated by reference in its entirety for any purpose. In one example, a $LaCoO_3$ layer of about 1 μm thickness or more is deposited in block 520. The thickness of the layer deposited in block 520 may vary, however, in accordance with implementation in particular fabrication facilities. Following deposition, an anneal, such as a rapid thermal anneal, may be used to convert an amorphous phase material to a crystalline phase, which may improve the thermal rectification properties of the thermal diode.

The blocks 510, 515, and 520 may be repeated, for example, to deposit the layers 310, 325, and 320 shown in FIG. 3.

In block 525, the electrocaloric effect material, and the first and second thermal diode layers may be patterned, using photolithographic techniques. In some examples, this may allow different chip areas on the substrate 105 of FIG. 1 to contact different heat sink stacks to keep one area of the chip from contributing heat to another area. In some embodiments, multiple stacks of ECE material and thermal diode may be serially connected to one another to generate greater temperature differentials.

The present disclosure is not to be limited in terms of the particular examples described in this application, which are intended as illustrations of various aspects. Many modifications and examples may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and examples are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular examples only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof.

Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 items refers to groups having 1, 2, or 3 items. Similarly, a group having 1-5 items refers to groups having 1, 2, 3, 4, or 5 items, and so forth.

While the foregoing detailed description has set forth various examples of the devices and/or processes via the use of block diagrams, flowcharts, and/or examples, such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one example, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the examples disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. For example, if a user determines that speed and accuracy are paramount, the user may opt for a mainly hardware and/or firmware vehicle; if flexibility is paramount, the user may opt for a mainly software implementation; or, yet again alternatively, the user may opt for some combination of hardware, software, and/or firmware.

In addition, those skilled in the art will appreciate that the mechanisms of the subject matter described herein are capable of being distributed as a program product in a variety of forms, and that an illustrative example of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While various aspects and examples have been disclosed herein, other aspects and examples will be apparent to those skilled in the art. The various aspects and examples disclosed herein are for purposes of illustration and are not intended to be limiting, with the true scope and spirit being indicated by the following claims.

What is claimed is:

1. A device, comprising:
    a substrate;
    an electrocaloric effect material at least partially supported by the substrate; and
    a thermal diode at least partially supported by the electrocaloric effect material, the thermal diode comprising two materials having different temperature coefficients of thermal conductivity, wherein the two materials are in thermal communication with one another.

2. The device of claim 1, wherein the two materials comprise two metallic oxide crystalline materials.

3. The device of claim 1, wherein the two materials comprise two cobalt oxide materials.

4. The device of claim 1, wherein the two materials comprise lanthanum cobalt oxide and lanthanum strontium cobalt oxide.

5. The device of claim 1, wherein the electrocaloric effect material comprises lead zirconate titanate.

6. The device of claim 1, wherein the thermal diode comprises a first thermal diode, and wherein the device further comprises:
 a second thermal diode between the substrate and the electrocaloric effect material.

7. The device of claim 1, wherein the electrocaloric effect material comprises a first electrocaloric effect material and the thermal diode comprises a first thermal diode, and wherein the device further comprises:
 a second electrocaloric effect material at least partially supported by the first thermal diode; and
 a second thermal diode at least partially supported by the second electrocaloric effect material.

8. The device of claim 1, further comprising a package that at least partially encloses the substrate, wherein the package is in thermal communication with the thermal diode.

9. The device of claim 1, further comprising:
 at least two electrodes positioned to apply an electric field across the electrocaloric effect material, wherein the electrocaloric effect material is configured to change temperature responsive to a change in the electric field, and wherein the thermal diode is configured to conduct heat away from the electrocaloric effect material.

10. The device of claim 9, wherein the substrate defines a first face and a second face, and wherein at least one of the at least two electrodes comprises an interconnect that extends from the first face through the substrate to the second face.

11. A method to transfer heat to or from a surface, the method comprising:
 applying an electric field across an electrocaloric effect material in thermal contact with the surface; and
 transporting heat through a thermal diode in thermal contact with the electrocaloric effect material to a heat dump, wherein the thermal diode comprises two materials having different temperature coefficients of thermal conductivity, wherein the two materials are in thermal communication with one another.

12. The method of claim 11, further comprising:
 removing the electric field across the electrocaloric effect material; and
 resisting heat transfer from the heat dump to the electrocaloric effect material with the thermal diode.

13. The method of claim 11, wherein applying the electric field comprises pulsing the electric field across the electrocaloric effect material; and
 wherein transporting comprises transporting heat through the thermal diode in a first direction during a pulse of the electric field.

14. The method of claim 11, wherein transporting heat includes operating the thermal diode to allow heat transfer away from the surface.

15. A method to make a heat transfer device, the method comprising:
 depositing an electrocaloric effect material on a surface of a substrate;
 depositing a first layer of a thermal diode on the electrocaloric effect material, the first layer of the thermal diode having a first temperature coefficient of thermal conductivity; and
 depositing a second layer of the thermal diode on the first layer of the thermal diode, the second layer of the thermal diode having a second temperature coefficient of thermal conductivity different than the first temperature coefficient of thermal conductivity.

16. The method of claim 15, wherein depositing the electrocaloric effect material comprises depositing lead zirconate titanate.

17. The method of claim 15, wherein depositing the first layer comprises depositing lanthanum cobalt oxide and depositing the first layer comprises depositing the first layer using pulsed laser or sputter deposition.

18. The method of claim 16, wherein depositing the second layer comprises depositing lanthanum strontium cobalt oxide and depositing the second layer comprises depositing the second layer using diketonate based vapor deposition.

19. The method of claim 15, further comprising patterning the electrocaloric effect material and the first and second layers of the thermal diode.

* * * * *